US011492725B2

(12) United States Patent
Li et al.

(10) Patent No.: US 11,492,725 B2
(45) Date of Patent: Nov. 8, 2022

(54) HIGH-STRENGTH SINGLE-CRYSTAL LIKE NANOTWINNED NICKEL COATINGS AND METHODS OF MAKING THE SAME

(71) Applicant: Purdue Research Foundation, West Lafayette, IN (US)

(72) Inventors: Qiang Li, Ames, IA (US); Xinghang Zhang, West Lafayette, IN (US); Haiyan Wang, West Lafayette, IN (US); Jie Ding, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/058,246

(22) PCT Filed: Jun. 25, 2019

(86) PCT No.: PCT/US2019/038998
§ 371 (c)(1),
(2) Date: Nov. 24, 2020

(87) PCT Pub. No.: WO2020/005949
PCT Pub. Date: Jan. 2, 2020

(65) Prior Publication Data
US 2021/0189581 A1    Jun. 24, 2021

Related U.S. Application Data

(60) Provisional application No. 62/690,181, filed on Jun. 26, 2018.

(51) Int. Cl.
*B32B 15/00* (2006.01)
*C30B 23/02* (2006.01)
(Continued)

(52) U.S. Cl.
CPC .............. *C30B 23/02* (2013.01); *B32B 15/01* (2013.01); *B32B 15/20* (2013.01); *C23C 14/165* (2013.01);
(Continued)

(58) Field of Classification Search
None
See application file for complete search history.

(56) References Cited

U.S. PATENT DOCUMENTS

2012/0135260 A1    5/2012    Jang et al.
2013/0089674 A1    4/2013    Chueh et al.
(Continued)

FOREIGN PATENT DOCUMENTS

CN    101144172 A    3/2008
CN    102321896 A    1/2012
(Continued)

OTHER PUBLICATIONS

Liu et al., "Mechanical properties of highly textured Cu/Ni multilayers", Jan. 2011, Acta Materialia, vol. 59, pp. 1924-1933 (Year: 2011).*

(Continued)

*Primary Examiner* — Seth Dumbris
(74) *Attorney, Agent, or Firm* — Hartman Global IP Law; Gary M. Hartman; Domenica N. S. Hartman

(57) ABSTRACT

A high-strength coatings and methods of fabrication to yield single-crystal-like nickel containing nanotwins and stacking faults.

11 Claims, 13 Drawing Sheets

(51) Int. Cl.

| | | |
|---|---|---|
| *B32B 15/01* | (2006.01) | |
| *B32B 15/20* | (2006.01) | |
| *C23C 14/16* | (2006.01) | |
| *C23C 28/02* | (2006.01) | |
| *C25D 3/18* | (2006.01) | |
| *C25D 5/18* | (2006.01) | |
| *C30B 7/12* | (2006.01) | |
| *C30B 29/02* | (2006.01) | |
| *C25D 5/00* | (2006.01) | |
| *C25D 7/00* | (2006.01) | |
| *B82Y 30/00* | (2011.01) | |
| *B82Y 40/00* | (2011.01) | |

(52) U.S. Cl.
CPC .............. *C23C 28/023* (2013.01); *C25D 3/18* (2013.01); *C25D 5/18* (2013.01); *C25D 5/605* (2020.08); *C25D 5/617* (2020.08); *C25D 7/00* (2013.01); *C30B 7/12* (2013.01); *C30B 29/02* (2013.01); *B82Y 30/00* (2013.01); *B82Y 40/00* (2013.01); *Y10T 428/12944* (2015.01)

(56) References Cited

U.S. PATENT DOCUMENTS

| | | |
|---|---|---|
| 2014/0217593 A1 | 8/2014 | Chen et al. |
| 2015/0233019 A1 | 8/2015 | Zhang et al. |
| 2020/0055725 A1* | 2/2020 | Sim .................... C23C 4/08 |

FOREIGN PATENT DOCUMENTS

| | | |
|---|---|---|
| EP | 1567691 | 8/2005 |
| TW | 201542888 A * | 11/2015 |

OTHER PUBLICATIONS

Meng, G. et.al., "Synthesis and Corrosion Property of Pure Ni with a High Density of Nanoscale Twins,"Electrochimica Acta 53 (2008) pp. 5923-5926.

Extended European Search Report, for Application No. 19824566.4, dated Dec. 17, 2021, 7 pages.

Anderoglu, O. et al., "Epitaxial Nanotwinned Cu Films with High Strength and High Conductivity", Applied Physics Letters 93, (2008), (4 pages).

El-Sherik, A.M. et al., "Synthesis of Bulk Nanocrystalline Nickel by Pulsed Electrodeposition", Journal of Materials Science 30 (1995), (7 pages).

Zhang, Z. et al., "A Novel Approach to Fabricating a Nanotwinned Surface on a Ternary Nickel Alloy", Materials and Design 106 (2016), (8 pages).

International Search Report & Written Opinion for International Application No. PCT/US2019/038998, dated Oct. 22, 2019, (11 pages).

* cited by examiner

HIGH-STRENGTH SINGLE-CRYSTAL LIKE NANOTWINNED NICKEL COATINGS AND METHODS OF MAKING THE SAME

CROSS-REFERENCE TO RELATED APPLICATIONS

This application claims priority to International Patent Application No. PCT/US19/038998 filed Jun. 25, 2019, which claims the benefit of U.S. Provisional Application No. 62/690,181, filed Jun. 26, 2018. The contents of these prior applications are incorporated herein by reference.

STATEMENT REGARDING FEDERALLY SPONSORED RESEARCH OR DEVELOPMENT

This invention was made with government support under DE-SC0016337 awarded by the Department of Energy. The government has certain rights in the invention.

BACKGROUND OF THE INVENTION

This disclosure relates to high-strength coatings on substrates. The invention particularly relates to high-strength nickel coatings that comprise single-crystal-like nickel containing nanotwins and stacking faults, and to methods of fabricating such coatings.

This section introduces aspects that may help facilitate a better understanding of the disclosure. Accordingly, these statements are to be read in this light and are not to be understood as admissions about what is or is not prior art.

Science and engineering communities has increasingly availed themselves of merging multidisciplinary knowledge. One recent practice is to couple nanotwinned (nt) materials with three-dimensional integrated circuits (3D IC) and micro/nanoelectromechanical systems (M/NEMS). Particularly, microelectronic and M/NEM devices call for the unprecedented advancement in materials equipped with high strength, elastic/plastic extensibility, electric/thermal conductivity, reliability and long life span, of which the nt metals might explicitly manifest the desirable combination. Twin boundaries (TBs) strengthen materials by impeding dislocation glide, carry plasticity by serving as sites for storage and migration of partial dislocations, and intrinsically bear lower boundary energy but better coherency that favors thermal stability and electrical conductivity. Demands for the progressive enhancement in these fields lie in wait for the integration of various nt metals.

Nt Cu has been extensively studied not only because of its potential applications in semi-conductive integrated circuits owing to its low electric resistivity (about $1.75 \times 10^{-8}$ Ω·m) at ambient temperature, but also its high twinnability favored by its low stacking fault energy (SFE, 45 mJ/m$^2$) with which the critical radius difference of perfect and twin nuclei becomes small, as well as its comparably low ratio of unstable twinning ($\gamma_{ut}$) to unstable SFE ($\gamma_{usf}$). So far, most of previously devised nt metals, besides Cu, have low-to-intermediate SFEs, e.g., Ag (about 16 mJ/m$^2$), and 330 austenitic stainless steels (about 10 to 20 mJ/m$^2$). The intrinsic characteristics of Cu, e.g., elastic modulus, curb its expansion in applications that have stricter demands. Random-oriented nt Cu with about 15 nm twin spacing has yielded at a maximum strength of about 900 MPa before undergoing softening upon which easy dislocation sources at TBs govern plasticity and epitaxial Cu with nanoscale twins preferentially oriented normal to growth direction delivered a maximum flow stress approaching 1 GPa. Furthermore, equiaxed- and columnar-grained nt Cu materials are inevitably furnished with grain boundaries (GBs) where plastic deformation concentrates to reduce ductility regardless of fabrication techniques. In addition, TB-GB junctions often act as dislocation nucleation sources and thus decrease strength. A few exceptions include the GB-free nt Cu nanopillars (about 110-160 nm in diameter) constructed via electron beam lithography but it merely demonstrated nanoscale production.

Exploitation on innate properties and applicative potentials of various nt metals, especially high SFE metals, has been inhibited due to high energy barriers within twinning and/or faulting process and lack of growth tactics. In Ni with a high SEF (about 120 to 130 mJ/m$^2$), deformation twins have been spotted in nanocrystalline form, under high strain rate deformation and in Ni alloys with reduced SFEs. Contrary to sporadic deformation twins, high-density growth twins raise greater interest as they have significant influence on physical or other properties. Lately, in order to greatly reduce SFE, a significant amount of heavy and costly solid-solution atoms (Mo and W) were co-sputtered with Ni to prepare highly twinned Ni alloys under ultrahigh vacuum (UHV), proposed for MEMS applications. It has also been demonstrated that energy barrier for twinning in Ni could be kinetically conquered in polycrystalline Ni using electrodepositions. However, these twinned Ni coatings often have random-oriented polycrystalline grains and thus the mechanical and physical properties of twinned Ni coatings are compromised. For instance, grain boundaries scatter electrons, and thus the electrical conductivity of polycrystalline Ni coating is reduced. Meanwhile, grain boundaries are vulnerable for corrosion as small impurity atoms, such as H, etc., can diffuse rapidly through grain boundaries and lead to grain boundary embrittlement.

Thus, there exists an unmet need for fabricating high-strength single-crystal like nickel where the Ni coatings without grain boundaries can provide a good combination of high strength, plasticity, high electrical conductivity and corrosion resistance.

BRIEF SUMMARY OF THE INVENTION

The present invention provides high-strength nickel coatings that comprise single-crystal-like nickel containing nanotwins and stacking faults, and to methods of fabricating such coatings.

According to one aspect of the invention, a high-strength nickel coating on a substrate comprises single-crystal-like nickel containing nanotwins and stacking faults.

According to another aspect of the invention, a method of fabricating a high-strength nickel coating on a substrate includes providing a substrate containing a copper coating obtained by sputtering and capable of acting as a cathode, and electrochemically depositing single crystal-like nickel atoms on the copper coating on the substrate using a nickel anode and an electrolyte.

Technical aspects of the coatings described above preferably include combinations of properties, as examples, high strength, plasticity, high electrical conductivity, and/or corrosion resistance, that are desirable for a wide variety of applications, including but not limited to integrated circuits, semi-conductive integrated circuits, and micro/nanoelectromechanical systems (M/NEMS).

Other aspects and advantages of this invention will be appreciated from the following detailed description.

BRIEF DESCRIPTION OF THE SEVERAL VIEWS OF THE DRAWING

Some of the figures shown herein may include dimensions. Further, some of the figures shown herein may have been created from scaled drawings or from photographs that are scalable. It is understood that such dimensions or the relative scaling within a figure are by way of example, and not to be construed as limiting.

DETAILED DESCRIPTION OF THE INVENTION

Figure 1A:
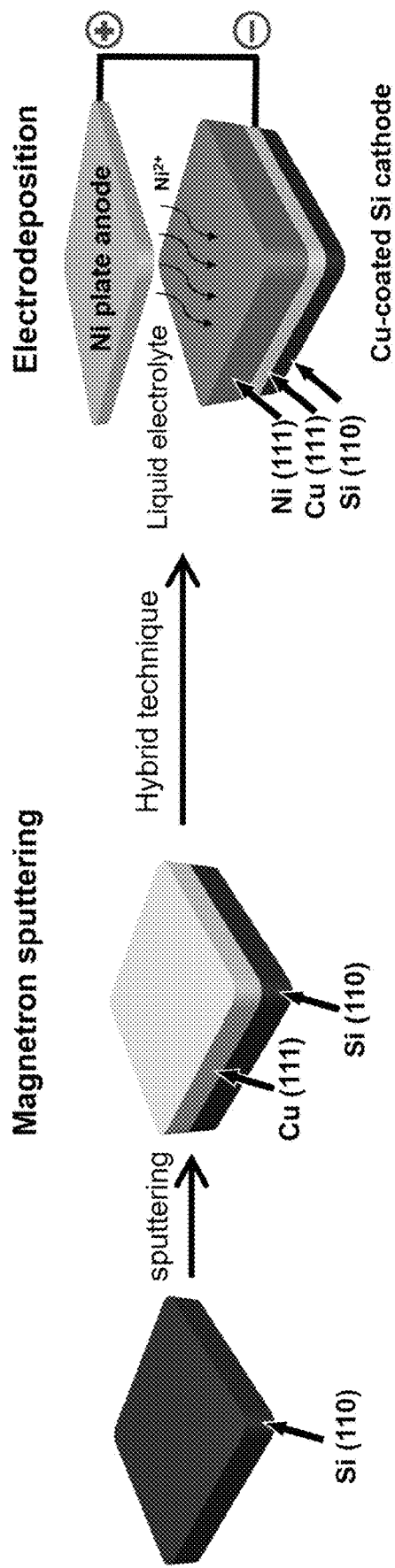
FIG. 1A shows a methodological approach to produce textured (nanotwinned) nt Ni adopting a hybrid technique of this disclosure. 1 μm-thick (111)-textured Cu was coated on 500 μm-thick Si(110) substrates (composite electrodes are denoted as Cu(111)@Si(110)) using magnetron sputtering with $1-2\times10^{-8}$ Torr base pressure. In cases of hybrid technique-derived Ni growth, the Cu-coated Si works as both conducting medium and growth template for electrodeposition in liquid based electrolyte.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

In this disclosure, the words "film" and "coating" (including their plurals) are used interchangeably and mean a surface layer formed on a physical object. Also, it is to be noted that in structures containing nanotwins (known to those skilled in the art), there is inter-twin spacing associated with the nanotwins. The inter twin spacing is distance between two coherent twin boundaries.

This disclosure describes a hybrid methodology adapted to heteroepitaxially grow GB-free, single-crystal-like Ni with high-density nanoscale twins (about 22 nm in thickness) on Cu(111)-coated Si substrates. It is disclosed that templating and a carefully conceived electrochemical recipe synergistically enhance the twinning propensity in metals with high SFEs, for which a growth mode transformation from 3D cluster growth to flat 2D layer-to-layer growth might be responsible. The transient electrodeposition rate of Ni is approximately 120-150 Å/s in this study, about sixty times that of UHV techniques. The in situ compressions on nt Ni reveal the GB-free, epitaxial nt Ni delivers an average yield strength and flow stress at 5% strain of about 1.9 and 2.1 GPa (lower bound), respectively, with obvious strain hardening. This disclosure provides opportunities to grow highly twinned textured materials with high SFEs.

Figure 1B:
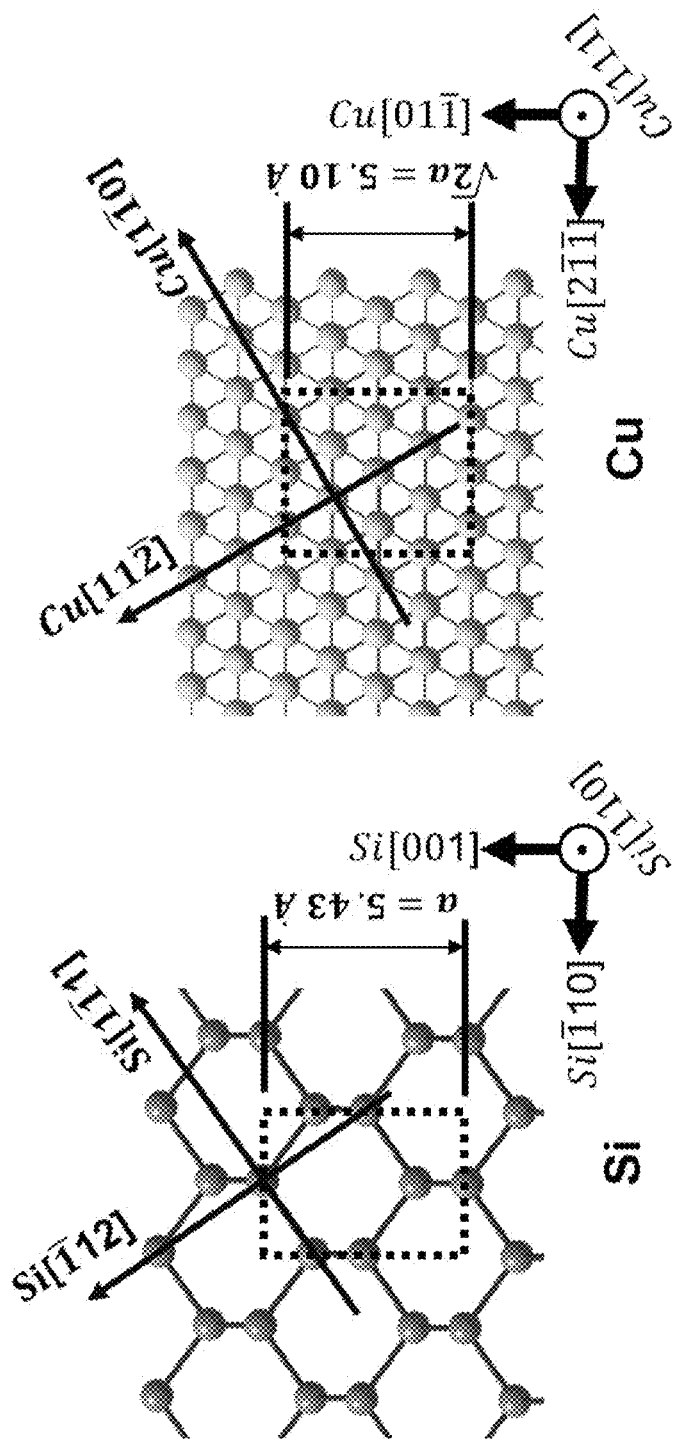
FIG. 1B schematically represents a crystallographic relation of heteroepitaxial (111)-textured Cu and a Si(110) substrate.

FIG. 1A shows methodological approaches to produce textured (nanotwinned) nt Ni adopting a hybrid technique. For purposes of this disclosure, "hybrid technique" refers to techniques for achieving nickel coating with sputtering of copper followed by electrodeposition of nickel. In experiments leading to this disclosure, a 1 μm thick (111)-textured Cu layer was sputtered on a silicon (110) wafer of 1 inch×2 inch, pretreated by about 48% hydrofluoric acid, in ATC flagship sputtering system (AJA International, Inc.) at a base pressure of $1$-$2\times10^{-8}$ Torr using Cu (99.99%) target. The epitaxial Cu acts as both an underlying conducting medium and growth template for Ni prepared by either ultrahigh vacuum (UHV) technique or electrodeposition. The purpose of precisely controlled projected dimensions of a Si wafer is to control the effective current density during electrodepositions. For UHV growth, sputtered nanotwinned Ni (s-nt Ni) was subsequently constructed onto 1 μm-thick (111)-textured Cu on Si(110) substrate within sputter chamber at room temperature. Prior studies showed that the Cu constructed on Si(110) substrates contains high-density twins constrained in columnar grains. For hybrid growth method, the epitaxial Cu-coated Si substrates were adopted as cathode electrodes for electrodepositions. The electrodeposition was conducted on a Dynatronix DPR40-15-30XR, a galvanostat pulse reserving current supply, which controls an effective current density, $J_{av}$, of 60-80 mA/cm² when pulse-on duration, $t_{on}$, and pulse-off duration (0 mA/cm²), $t_{off}$, was 2 ms and 2 ms, respectively, throughout this study, and amid a water bath held isothermally at about 45° C. The cathode and anode, high-purity Ni plate, were both immersed underneath electrodeposition bath for 1 inch and kept at 4 cm separation distance. Ni anode continuously replenished the consumed ions in bath. The electrodeposition electrolyte was composed of 0.85 M nickel (II) chloride hexahydrate ($NiCl_2 \cdot 6H_2O$), 0.065 M nickel (II) sulfamate tetrahydrate ($Ni(SO_3NH_2) \cdot 4H_2O$) and 0.4 M boric acid ($H_3BO_3$). 0.005 M of an organic additive (sodium saccharin) was selectively added to the electrolyte for additive-assisted electrodeposition (AAEP) to alter growth modes. For fabrication of nanocrystalline (nc) Ni, polycrystalline Cu was sputtered onto a 100 nm-thick $SiO_2$-coated Si(100) wafer as cathodes prior to electrodeposition. The hybrid technique and monolithic UHV technique are laid out in FIG. 1A. FIG. 1B shows crystallographic relation of heteroepitaxial (111)-textured Cu and Si(110) substrate.

Figure 2:
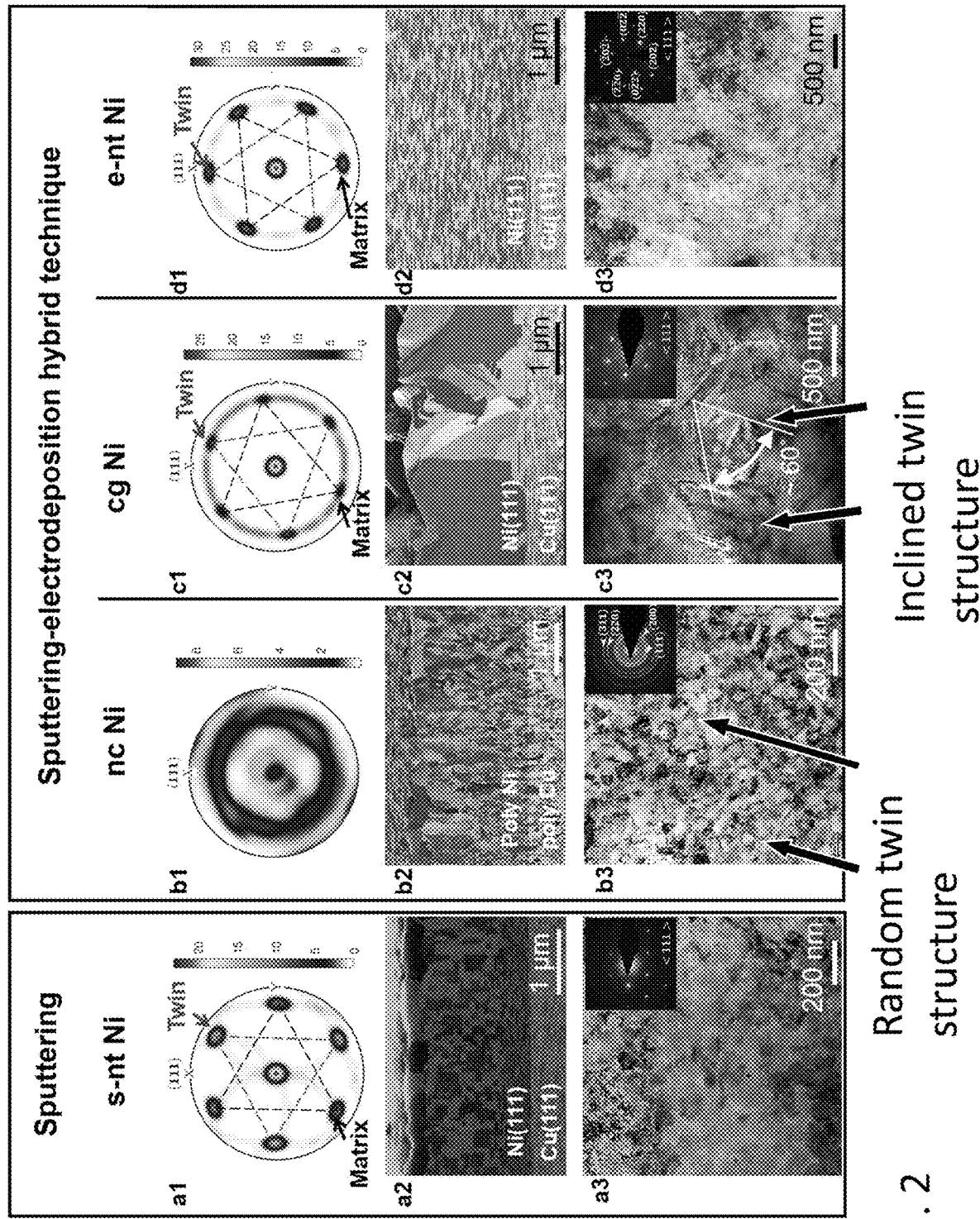
FIG. 2 shows crystallographic and microstructural information of four different Ni samples, including representative X-ray {111} pole figures, cross-sectional focused-ion-beam ion channeling (XFIB) images and plan-view (PV) TEM micrographs with corresponding selected area diffraction (SAD) patterns are present. Images (a1)-(a3): As embodiment of UHV fabrication, sputtered Ni on Cu(111)@Si(110), hereafter denoted as s-nt Ni, exhibits epitaxial growth and block-like twin structure with giant twin spacing. Images (b1)-(b3): Nanocrystalline (nc) Ni was electrodeposited on polycrystalline Cu on 100 nm SiO2-coated Si(100) through additive-assisted electrodepositions (AAEP). Random-oriented nanotwins are indicated by red arrows and GBs are predominant. Images (c1)-(c3): Coarse-grained (cg) Ni with preferential (111) texture was grown on Cu(111)@Si(110) substrates by electrodeposition with no additive assistance and high-density inclined twins, marked by red arrows, with 60° intersection angle were frequently observed within coarse grains. This sample is hereafter denoted as cg-nt Ni. Astonishingly, images (d1)-(d3) show single-crystal-like, GB-free Ni with nanotwins normal to growth direction, hereafter denoted as nt Ni, was attained on Cu(111)@Si(110) substrates via AAEP. The {111} x-ray pole figure shows a high intensified center spot and 6 equally bright spots with 6-fold symmetry at Chi angle equal to about 70.5°, suggesting highly twinned epitaxial Ni. The fine, alternative contrast caused by XFIB suggests fine nanoscale twin structures and wavy TBs indicate complex blends of Σ3 {111} CTB and Σ3 {112} ITB segments. Typical PV TEM and XFIB images both reveal a GB-free nt-Ni.

Tunable twin structures through hybrid techniques: FIG. 2 shows crystallographic and microstructural information of four different Ni samples, including representative X-ray {111} pole figures, cross-sectional focused-ion-beam (FIB) ion channeling images and plan-view TEM micrographs with corresponding selected area diffraction (SAD) patterns. The four different samples are: s-nt Ni refers to sputtered nanotwinned nickel on copper coated silicon substrate; nc Ni refers to nanocrystalline nickel on copper coated silicon substrate prepared by a hybrid technique; cg-nt Ni refers to coarse-grained nanotwinned nickel on copper coated silicon substrate prepared by a hybrid technique; nt Ni refers to nanotwinned nickel on a copper-coated silicon substrate prepared by a hybrid technique.

Epitaxial growth of (111)-textured Cu on Si(110) has been well studied and it contains columnar grains with densely packed nanotwins in UHV techniques because of its low SFE. In this disclosure, the feasibility of adopting the composites as template to grow nt Ni was conceived, considering the lattice mismatch of about 2.6% between Cu and Ni ($a_{Cu}$=3.615 Å; $a_{Ni}$=3.52 Å). Ni films were first sputtered on (111)-textured Cu-coated Si(110) substrates (referred to Cu(111)@Si(110) herein) using monolithic UHV technique. Image (a1) of FIG. 2 shows the X-ray {111} pole figure of the sputtered Ni, and the highly intensified central spot and six spots arranged in a hexagonal fashion at Chi angle of about 70.5° with equal brightness indicate that the sputtered Ni has strong (111) texture with volumetric fraction of twin variant about equal to that of matrix. It was found that the sputtered Ni, denoted as s-nt Ni, contained thick twins from a cross-sectional FIB ion-channeling image (image (a2) of FIG. 2). Additionally, the epitaxial growth is supported by the pole figure (image (a1) of FIG. 2). Plan-view transmission electron microscopy (TEM) image and SAD pattern in image (a3) of FIG. 2 also confirmed the formation of epitaxial films with low angle grain boundaries.

Hybrid techniques of this disclosure involve template and carefully conceived electrochemical recipes to synergistically tune twin structures and enhance twinning propensity in metals with high SFEs. The two techniques, i.e. monolithic UHV technique and hybrid technique, are illustrated in FIG. 1A and Table 1 below.

TABLE 1

Summary list of experimental and texture conditions of the as-fabricated specimens.

| Specimen name | Fabrication technique | Template | Additive-assisted (Y/N) | Texture |
|---|---|---|---|---|
| s-nt Ni | UHV | Cu(111) | — | Ni(111) |
| nc Ni | Hybrid | Poly-Cu | Y | Ni(200)&(111) |
| g-nt Ni | Hybrid | Cu(111) | N | Ni(111) |
| nt Ni | Hybrid | Cu(111) | Y | Ni(111) |

Note:
"UHV" and "Poly" refer to ultrahigh vacuum and polycrystalline, respectively.

Figure 3:
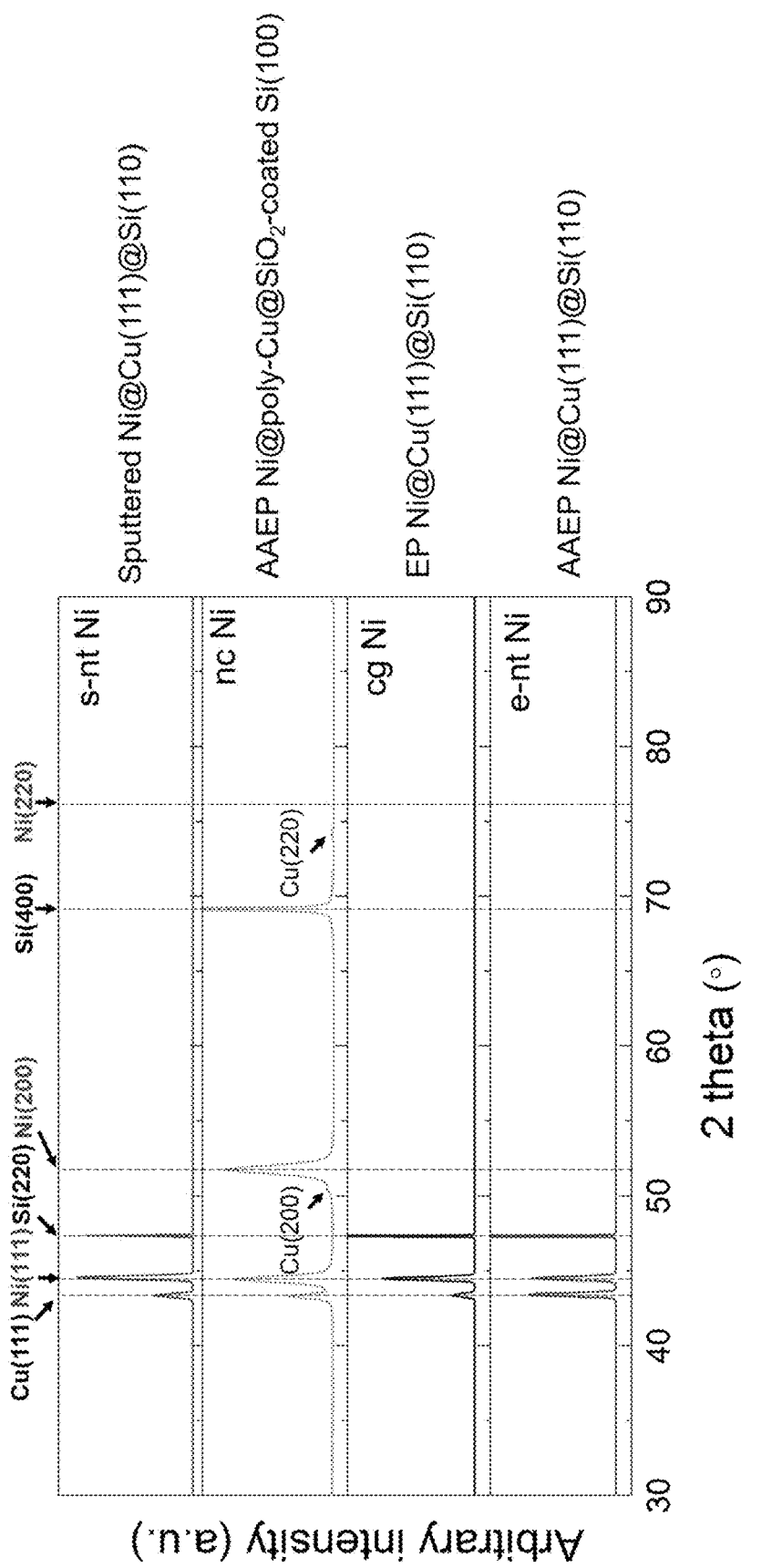
FIG. 3 shows XRD profiles of as-fabricated Ni specimens via different conditions with different microstructures, including s-nt Ni (magnetron sputtered Ni on Cu(111)@Si (110)), nc Ni (AAEP Ni on polycrystalline Cu@ 100 nm SiO2-coated Si(100)), cg-nt Ni (EP Ni on Cu(111)@Si(110)) and eventually nt Ni (AAEP Ni on Cu(111)@Si(110)). In the case of nc Ni growth, polycrystalline Cu was grown on $SiO_2$-coated Si(100) substrates that have been used as cathodes, prior to Ni electrodeposition. s-nt Ni, nc Ni and cg-nt Ni stand for sputtered nanotwinned Ni, nanocrystalline Ni and coarse-grained Ni, respectively.
Figure 4:
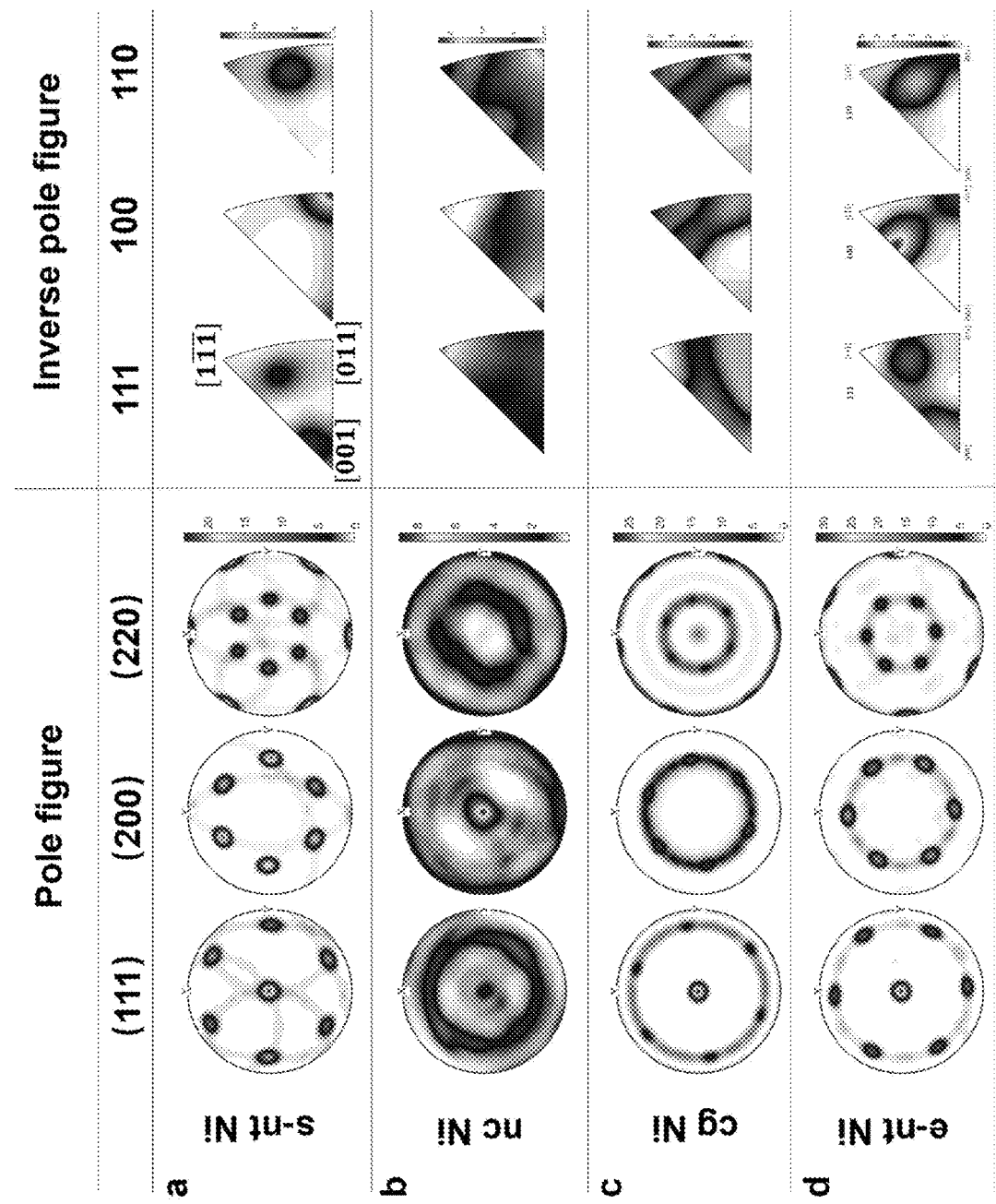
FIG. 4 shows in images (a)-(d) pole figures and corresponding inverse pole figures of s-nt Ni, nc Ni, cg-nt Ni, and nt Ni, respectively.

Polycrystalline Cu that stemmed from 100 nm $SiO_2$-coated Si(100) was adopted to electrodeposit Ni (images (b1), (b2), (b3) of FIG. 2). X-ray {111} pole figure in image (b1) of FIG. 2 implies that the Ni is polycrystalline but possesses a preferential (100) texture, coexisting with a comparably faint (111) texture, and the polycrystalline Ni consists of nanocrystals somewhat elongated along the growth direction, evidenced by the FIB and the plan-view TEM images shown in images (b2) and (b3) of FIG. 2. This specimen is referred to as nanocrystalline (nc) Ni. The XFIB image (image (b2) of FIG. 2) shows that the nanocrystals adjacent to Ni/Cu interface tend to replicate the structure of the grains in Cu template. Some random-oriented nanotwins in Ni nanocrystals are observed (marked by arrows), whereas the conventional GBs are predominant. While Ni was electrodeposited on Cu(111)@Si(110) with no assistance of additive, a preferential (111) texture is developed (as shown in image (e1) of FIG. 2). FIB ion microscopy image taken along the Ni-<110> direction in image (c2) of FIG. 2 reveals vertical boundaries and inclined TBs in coarse grains with respect to film radial directions (the sample is referred to as cg-nt Ni hereafter), which coincides well with the plan-view TEM observation (image (c3) of FIG. 2) displaying high-density inclined twins that intersect with out-of-plane (111) surface and mostly mutually intercept at about 60°. Intriguingly, under equivalent electrodeposition parameters, additive-assisted electrodeposition (AAEP) of Ni on Cu(111)@Si(110) produced single-crystal-like, GB-free nt Ni with high-density fine twins. {111} X-ray pole figure carried out at large scale in image (d1) of FIG. 2 exhibits one strong central spot and 6 bright {111} spots with 6-fold symmetry with no extra appearance of intensified signal, indicating heavily twinned Ni, hereafter denoted as nt Ni, heteroepitaxially grown on Cu template. Furthermore, XFIB image in image (d2) of FIG. 2 taken at Ni-<111> zone axis ubiquitously reflects fine and densely-packed nanostructures with wavy horizontal and vertical boundaries, if conceded as TBs, perhaps suggestive of complex Σ3{111} coherent twin boundary (CTB) and Σ3{112} incoherent twin boundary (ITB) combination, which will be discussed in detail. Frequently, examined across dozens of micrometers, no equiaxed or columnar GBs were spotted. The plan-view TEM image taken from <111> zone axis substantiates the single-crystal-like, GB-free characters (image (d3) of FIG. 2). FIG. 3 shows XRD profiles of as-fabricated Ni specimens via different conditions with different microstructures. Images (a)-(d) of FIG. 4 show, respectively, pole figures and corresponding inverse pole figures of s-nt Ni, nc Ni, cg-nt Ni, and nt Ni. Systematic crystallographic supporting materials can be found in FIGS. 3 and 4. It can be deduced from the distinctive microstructures that both template (and seed layer) and electrochemical recipes play crucial roles on the growth of nt Ni. For clarification, template promotes (111) texture, a crystallographic environment for high-density twin formation, whereas additive assistance geometrically refines twin structures, a proposition that will be further discussed. It is worth pointing out that the transient electrodeposition rate is about 120-150 Å/s, which was about sixty times higher than UHV techniques in this study, which will lower the technological barrier in transforming the fabrication from lab-scale to industry.

Figure 5:
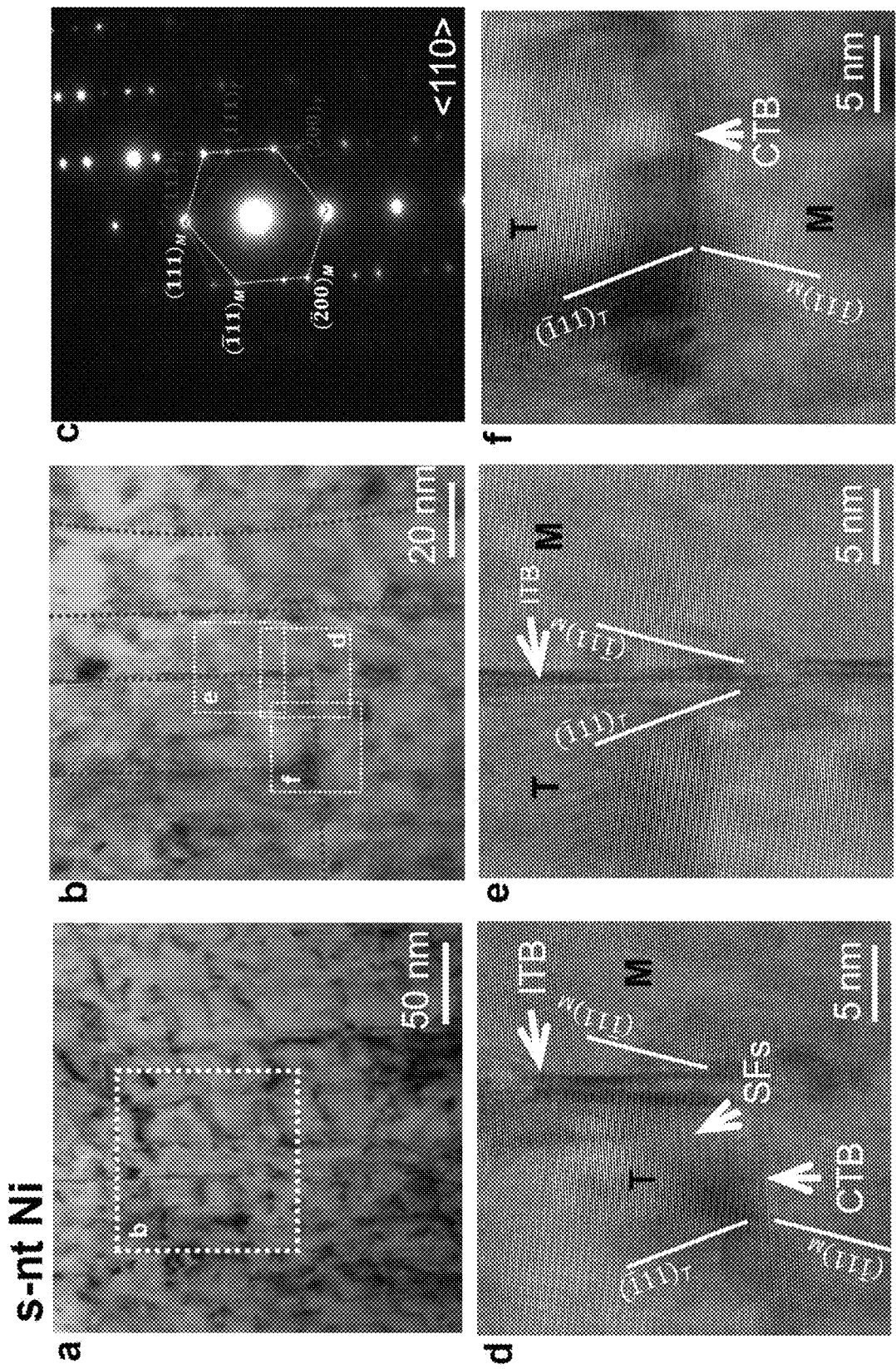
FIG. 5 contains images (a)-(f) showing microstructures of as-fabricated s-nt Ni with ITBs and block twins. Image (a): The low magnification cross-section TEM micrograph shows columnar grains with columnar grain size of about 63+20 nm in FIG. 8. Image (b): The magnified TEM micrograph of several adjacent columns, and the fast Fourier transform (FFT) pattern taken from the selected area suggests some of the columnar grains have in-plane rotation for certain degree and some emerging columnar boundaries might be low angle grain boundaries. This might complicate the columnar grain size statistics and overestimate the grain size. Image (c): SAED pattern shows typical twin diffraction pattern in highly (111)-textured specimens. Image (d): More importantly, the high resolution TEM image shows that s-nt Ni possess twins resembling block-shape due to their large CTB separation distance. The twin spacing is 182+118, indicative of broad twin spacing distribution. The long ITBs are intersected with horizontal CTBs, which is in good agreement with its corresponding XFIB image in FIG. 1A. Image (e): Matrices and twins in two adjacent nanocolumns are separated by ITBs and ITBs are slightly diffused. Image (f): The CTBs are decorated by stacking faults with certain thickness.
Figure 6:
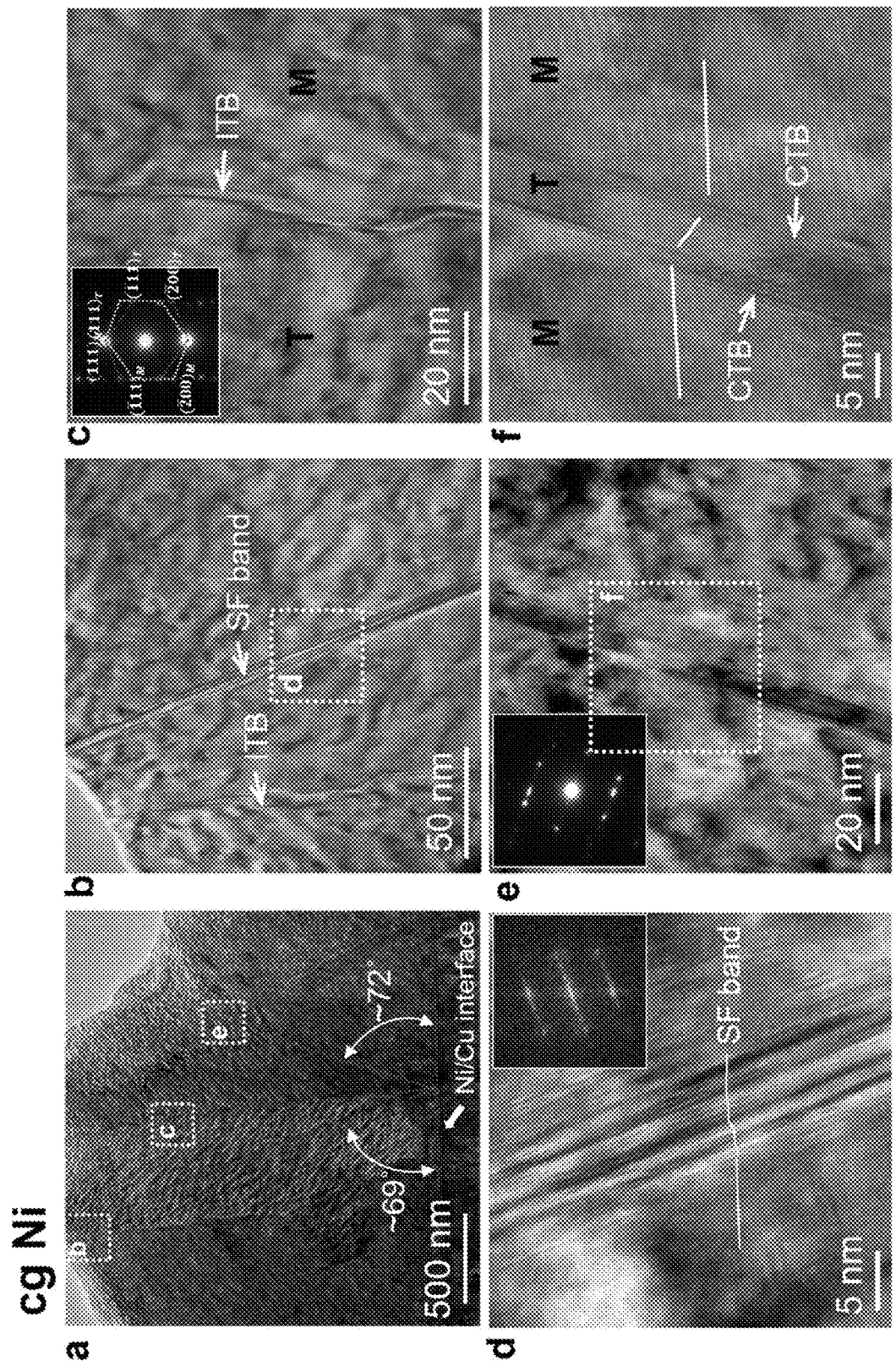
FIG. 6 contains images (a)-(f) showing microstructures of as-fabricated cg-nt Ni with giant grain size and inclined CTBs. Image (a): The low magnification cross-section TEM micrograph shows giant grains separated by nearly perpendicular boundaries and within the grains, many inclined boundaries that have about 70° relations with out-of-plane (111) planes. Image (b): The magnified TEM micrograph clearly shows one ITB that separates two adjacent grains and a narrow structure comprised of stacking fault band on another inclined {111} glide planes. Image (c): Magnified TEM image exhibits a curvy ITB bounded by matrix and twin regions. Image (d): On the inclined glide plane ($\bar{1}11$), besides twinning activities, some patterns are identified as stacking fault (SF) band made of SF arrays. Stretched diffraction spots in the corresponding FFT pattern confirm the high-density SF cluster. Image (e): Very fine inclined twin structures are frequently present on twinning planes. The SAED suggests typical twin relation and the matrix and twin are mirror-symmetrical with respect to ($\bar{1}11$) planes. The present fine twin is about 5 to 8 nm thick and the inclined twin spacing is 67+59 nm. Image (f): High resolution TEM image reveals the characteristics of the CTBs. The CTBs are decorated with 1-2 nm thick SF ribbons. The cg-nt Ni with giant grain size and inclined twin structures is prepared without the assistance of organic additive and the surface roughness of cg-nt Ni is in micron level.
Figure 8:
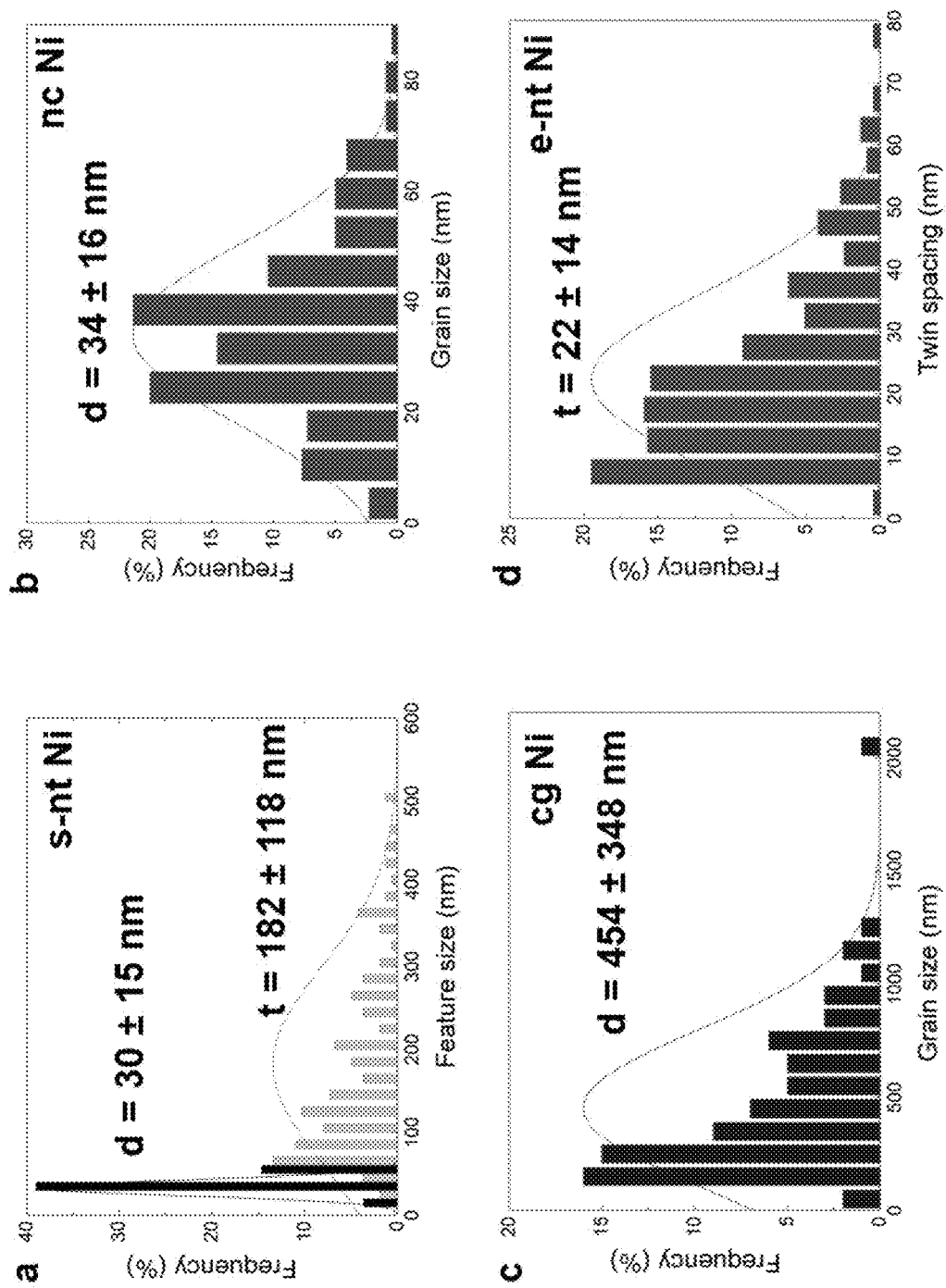
FIG. 8 contains graphs (a)-(d) showing statistics of boundary spacing and twin spacing, equiaxed/columnar grain size are distinguished. Graphs (a)-(d) represent, respectively, s-nt Ni, nc Ni, cg-nt Ni, and nt Ni specimens. The cg-nt Ni and nt Ni specimens were fabricated using the same electrodeposition parameters except the nt Ni specimen was prepared with the assistance of organic additive, but both twin propensity and feature dimension are dramatically changed. Size distribution has been calculated using Gaussian distribution under the central limit theorem. 250-350 structural features, namely grain size and twin spacing, were counted based on TEM studies for statistics. One exception is that statistic done on the cg-nt Ni specimen was based on cross-sectional focused-ion-beam ion channeling (XFIB) studies owing to the interference of inclined twin boundaries into the scope and ambiguous selection of grain boundary separation distance.

Twin structure attributes: By conducting monolithic UHV technique, the sizable twins were attained, unlike fine twin structure in Cu (SFE, 45 mJ/m²) prepared at equivalent sputtering parameters. FIG. 5 shows microstructure of as-fabricated s-nt Ni with ITBs and block twins. Referring to FIG. 5 it is seen that the sizable twins consist of long segments of vertical ITBs terminated by CTBs, hence making themselves resemble block-shape-like structure. The size of the columnar grains bounded by ITBs is determined to be about 63±20 nm and mean CTB separation distance to be about 182±118 nm (FIG. 8). Notable low-angle GBs revealed by TEM micrographs are ascribed to modest in-plane rotation amongst sub-nanocolumns. The sizable twins, though peculiar, may insufficiently harden materials due to limited volumetric density of the twin structure. In textured films yet produced under UHV conditions, twinning in Ni occurred when TBs penetrated from periodic repeating Cu nanolayers across coherent phase boundary in Cu/Ni multilayer system. Also, random-oriented twins were recently observed in polycrystalline Ni prepared under UHV. Standing at a thermodynamic point of view, it is expected that a low SFE, $\gamma_{sf}$, low temperature and high-flux deposition to be able to enhance the twinning propensity. At extreme sputtering settings, a temperature as low as −150° C. and a very high deposition rate of about 125 to 300 Å/s were required to form coarse twins. It was predicted that conducting electrodeposition, likewise a non-equilibrium process but with escalated deposition flux, could overcome energy barrier and produce high-density twins. It was seen in electrodeposited polycrystalline Ni that twins with mean spacing of about 50 nm existed in about 500 nm grain interiors. In the hybrid technique, (111)-textured Cu-coated Si(110) was employed as cathodes submerged in liquid-based electrolyte to electrochemically grow Ni. XTEM micrograph in image (a) of FIG. 6 implies that the high-flux electrodeposition merely gave rise to coarse grains with an average grain size of about 454 nm in (111)-textured Ni, and nearly vertical and inclined boundaries coexist, well in accordance with XFIB observation (image (c2) of FIG. 2). FIG. 6 shows microstructure of as-fabricated cg-nt Ni with giant grain size and inclined CTBs. HRTEM images and the inset SAD disclose that the nearly vertical boundaries are ITBs (images (b) and (c) of FIG. 6), whereas the inclined streaks are identified as SF cluster ribbons and CTBs on ($\bar{1}$11) glide planes and their interception angle with out-of-plane (111), whose normal direction is parallel to growth direction, almost coincides with the theoretical value of 70.53° (images (d) and (e) of FIG. 6). The inclined twin width spans from several nanometers to about 50 nm, hence resulting in comparably low twin volumetric fraction to impede dislocations. It should be noted that the inclined twins have mirror symmetry with respect to ($\bar{1}$11) glide planes (image (f) of FIG. 6), which makes the out-of-plane texture in the twin variants ($\bar{1}$15) rather than (111) in matrices. As a result, the (111) texture would inevitably get imperfect.

Figure 7:
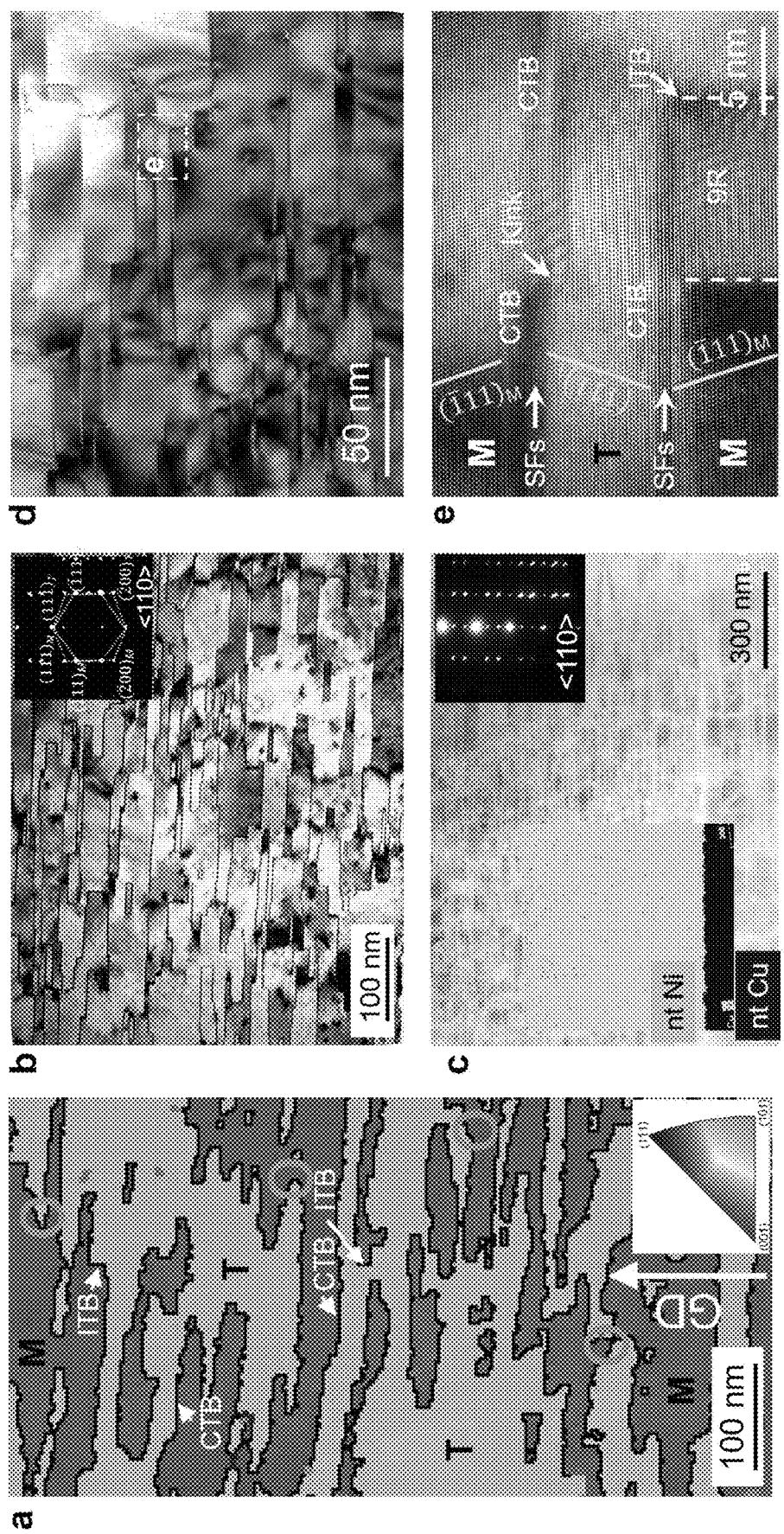
FIG. 7 contains images (a)-(e) showing microstructures of nt Ni. Image (a): An automated crystal orientation mapping (ACOM) of nt Ni prepared by a hybrid technique of this disclosure. Some classic CTBs and ITBs are circled and majority of wavy boundaries are determined to be TBs (defined in accord with 0.3 coincidence site lattice (CSL) boundaries; labeled in black), indicating a complicated web of CTB and ITB segments. Few conventional GBs are spotted and the film grow direction (GD) is marked. Image (b): low-magnification XTEM micrograph along with the corresponding SAD pattern show high-density stepped nanotwins with no GBs. Image (c): Scanning TEM (STEM) micrograph and energy-dispersive X-ray spectroscopy (EDS) show nt Ni grown on Cu template. The SAD taken from <111> zone axis at Ni/Cu interface reveal {200}, {111} diffraction divergence and thus proves the heteroepitaxial growth of Ni on Cu(111) template. Image (d): Intermediate magnification TEM micrograph highlights the stepped TB structure composed of CTB and ITB segments. Image (e): High-resolution TEM (HRTEM) micrograph shows that the CTBs are decorated by stacking faults (SFs) and ITBs have dissociative character, forming 9R phase with dissociation distance of about 10 nm. M and T stand for matrix and twin, respectively.

However, additive-assisted electrodepositions and Cu(111) templating reached a synergistic effect on making highly-twinned structure in Ni with high SFE in hybrid approach. The characteristics of the distinctive TBs have been examined by nanodiffraction-based automated crystal orientation mapping (ACOM) carried out in a TEM using the NanoMegas Astar diffraction system (image (a) of FIG. 7). The ACOM reveals high-density twin islands are isolated by curvy TBs alone (marked with black), even for vertical segments, in sharp contrast to TBs terminated at conventional GBs in nt materials heretofore created, manifesting a single-crystal-like nt Ni with two crystallographic registries having 60° rotation relationship; notwithstanding, some crystallographic and surface irregularities also formed due to high-flux deposition. Recent studies on textured nt Cu showed that CTBs, though defective, terminated at GBs. A majority of TBs appear stepped (some classic steps are marked by circles) and few straight CTBs and ITBs are identified (marked by arrows), suggestive of frequent, complex blends of Σ3{111} CTB and Σ3{112} ITB segments. The step height exceeds pixelation size. Shown in image (b) of FIG. 7, the XTEM image confirms the ACOM observations and shows no evidence of GBs, meanwhile it reflects a hierarchical character of the TBs; that is, secondary twin structures are affixed to primary ones by generating vertical steps composed of partial dislocations and twin variants are interlaced with matrices. The twin spacing is determined to be 22±14 nm (FIG. 8). The cross-sectional scanning TEM (STEM) image together with energy dispersive X-ray spectroscopy (EDA) image mark the notable Ni/Cu interface and display that the twins in Ni initiated at the interface (image (c) of FIG. 7). Furthermore, the inset SAD captured at Cu/Ni interface along Si-<111> direction and Cu-<110> direction shows lightly divergent diffraction spots, which confirms the orientation relationship in this system being Ni [111]//Cu [111]//Si [110], and Ni [1$\bar{1}$0]//Cu [1$\bar{1}$0]//Si [1$\bar{1}$1]. The stepped twins with hierarchy can be better appreciated in zoomed-in XTEM micrograph in image (d) of FIG. 7. A closer examination of HRTEM image exhibits detailed TB characteristics in image (e) of FIG. 7. Inserted solid lines help realize that (11) planes in matrices and twins are mirror-symmetric across CTBs. Noted that the crystallographic registry across CTBs is somewhat degraded, attributed to planar SFs attached to CTBs. Some kink-like steps are 0.3{112} incoherent segments below about 1-2 nm in height, and, primarily, big "stairs" greater than about 5 nm are found to have dissociative character on ITBs. The dissociated ITBs can be represented by a periodically repeated set of partial dislocations on each (111) planes and are determined to be so-called 9R phase, which typically was formed under shear stress in metals with low SFEs, e.g., Cu and Ag. An interesting point is that not only did the 9R formation take place in Ni prepared under a hybrid technique, but also their dissociation distance can be as long as about 100 nm (about 11 nm in image (e) of FIG. 7). It is noteworthy that the single-crystal-like, GB-free nt Ni has been produced using same Cu(111) template under same electrochemical conditions as cg-nt Ni, but the engagement of additive greatly changes the twin geometry and enhances the twinning propensity, as evidenced by the drastically different microstructural evolution.

Twin formation mechanism: The cg-nt Ni maintains the crystallographic registry between nuclei and Cu substrate within heterogeneous nucleation but still subject to enormous grain coalescence. The vertical ITBs signal a three-dimensional (3D) growth mode by means of impingement twin formation with large island length scale. Typically, the microstructure electrodeposited on single-crystal metals underwent a sequential transition from nanometric epitaxial zone, polycrystalline to 3D clusters through defect formations upon thickness buildup. The high-density nanoscale twins and single-crystal-like, GB-free characters feature the AAEP-induced nt Ni, for which a swapped growth mechanism must be responsible. Organic additives in industrial electroplating are known as inhibitors prone to adsorb on cathode surface; therefore, the motions of Ni$^{2+}$-containing intermediates are expected to be obstructed and burgeoning nucleation sites surge. The additive assists in promoting nucleation and reducing island radius, favoring a transition from 3D cluster growth (Volmer-Weber mode) to flat 2D layer-to-layer growth (Frank-van der Merve mode), which has been verified in Cu electroplating. The origin of ubiquitous TBs and absence of GBs remain an open question. The twin formation may have been attributable to a strain energy-driven process. For example, the inclined twin formation in cg-nt Ni is considered energetically unfavorable. To be specific, for a 5 nm-thick inclined twin that propagates through a 2 μm-thick film in image (f) of FIG. 6, provided that the CTB energy, $\gamma_{Ni}^{CTB}$, in Ni is 63 mJ/m$^2$ and the energy of Σ5{310} GBs is taken as the ITB energy, $\gamma_{Ni}^{ITB}$, i.e. 1,469 mJ/m$^2$, the energy carried by the CTBs bounding the twin lamella is $4 \times 10^{-6} \gamma_{Ni}^{CTB}/\sin 70.53°$, equal to about 2.67×10−4 mJ/m, whereas the energy an ITB bears is $5\times10^{-9}\ \gamma_{Ni}^{ITB}/\sin 70.53°$, equal to about 7.35×10−6 mJ/m if a growth twin terminates inside a grain interior. Hence, it announces that the residual stress paid for the energy penalty for the energetically unfavorable twin propagation. Also, the nc Ni, constructed on polycrystalline Cu with a stronger (111) texture, has developed (100) texture to accommodate larger strain. Especially, the 9R phase in nt Ni is high-energy defects but it casts zero-strain to the system due to its zero sum of the Burgers vectors of the three repeatable partials. Forming 9R with long dissociation distance in metals with high SFEs was regarded impractical. This suggests that large strain energy remained and drove structural development in the Ni specimens. In 2D growth mode in nt Ni, it is possible that the TB formation would suppress the GB initiation to compensate the strain energy; meanwhile, (111) texture and the sufficient kinetic energy in deposition system may partly account for the twin formation. However, independent explicit studies are necessary to conclusively decipher the twin formation mechanism.

Figure 10:
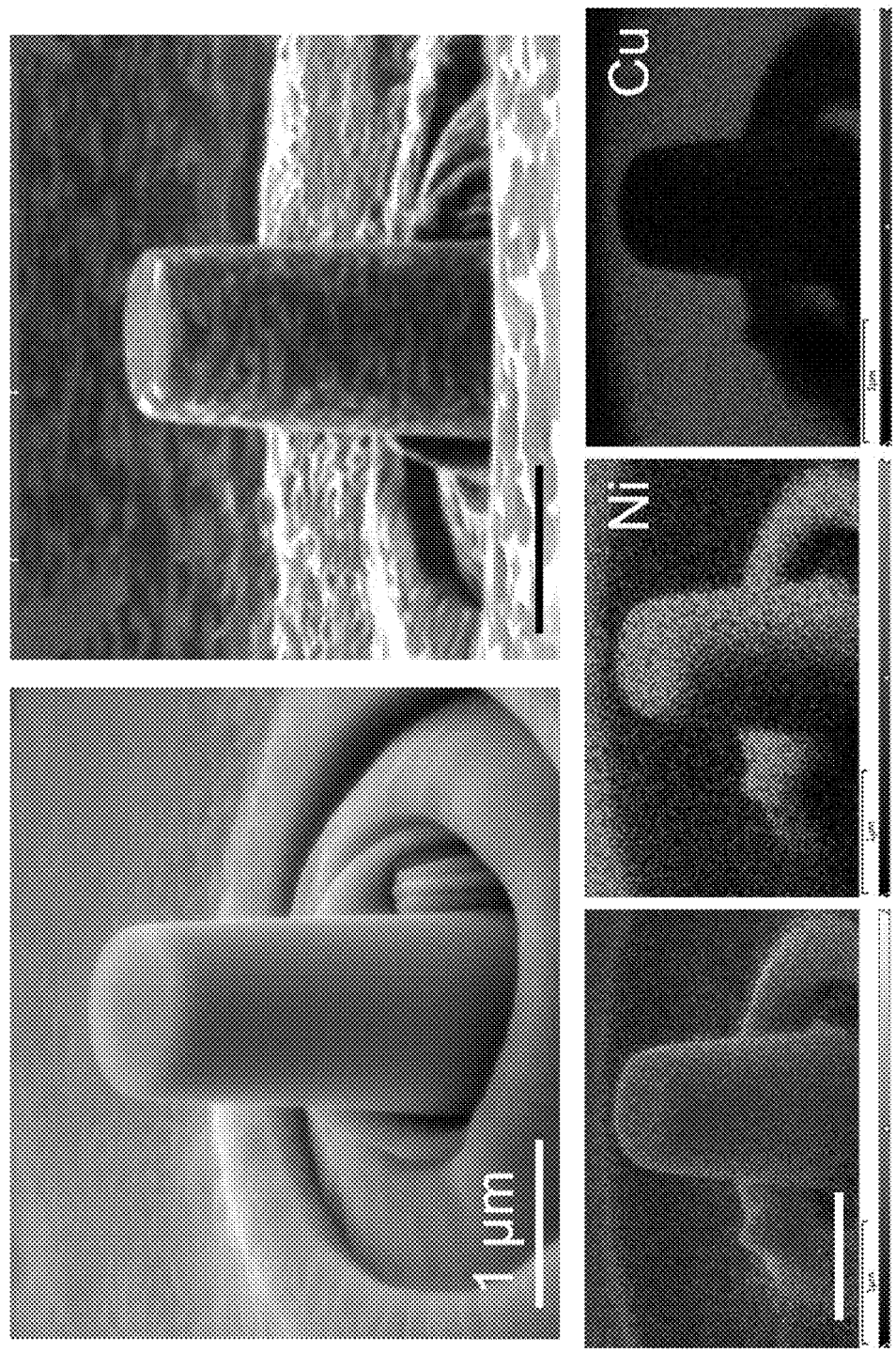
FIG. 10 shows SEM, XFIB image and EDS images of the nt Ni pillars. The Cu templates with lower stiffness tend to cause buckling of pillars subjected to uniaxial compressions, which potentially causes premature softening upon deformation up to high strain if Cu appears as a pillar sector. EDS has been employed to confirm that pillars are merely made of nt Ni, marked in green color distinct from Cu in red color in elemental mappings.

Strengthening and plasticity via in situ SEM compressions: In situ compression experiments were carried out on four different specimens prepared by UHV and hybrid techniques inside a scanning electron microscope (SEM) using Hysitron PI 88xR PicoIndenter to unveil their mechanical response and spontaneous deformation. To decipher the mechanical behaviors and real-time deformation of various nt Ni, uniaxial compression experiments were carried out using a Hysitron PI 88xR PicoIndenter with a 5 μm diamond flat punch indenter inside an FEI quanta 3D FEG scanning electron microscope (SEM). A piezoelectric actuator on the capacitive transducer captured the force-displacement response. The strain rate was constantly set at $5.0\times10^{-3}$/s for all specimens in a displacement-control mode, suggesting most of experiments would be finished below than 60 s. To circumvent the misalignment-derived data scattering frequently observed in ex-situ compression testing, we introduce an "impact crater" method to correct alignment between micropillar and indenter axial directions. Summarily, the dihedral angle of sample surface and circular depression surface created by intentionally regulated impact of flat punch indenter on sample was measured. Then, upon detachment, alignment was correspondingly adjusted through rotation and tilting of in situ sample stage. Partial unloading segments were designed in loading functions to verify alignment reliability. 50 μN force was applied upon indenter-pillar head contact for 40 s to correct the drift rate, which was 0.1-0.4 nm/s estimated during the pre-loading process. The displacement and force noise level was detected to be ±0.35 nm/s and ±5 μN on average, respectively. Micropillars having about 1 μm in diameter and a diameter-to-height aspect ratio of 1:3-1:2 were made with a dual-beam focused-ion-beam (DB-FIB) and through a series of concentric annular milling and polished with progressively de-escalated currents. A 10 pA of ion beam current was eventually used to minimize the ion damage and tapering angle. Coarse-grained nanotwinned Ni specimens have micron-degree roughness that would devastate the flat punch-to-pillar alignments. The roughness was eliminated and the micropillar heads were flattened by 10 pA ion beam as axial direction of micropillars was aligned normal to ion beam incidence direction. The underlying Cu templates tend to cause buckling of pillars subjected to uniaxial compression, and therefore, energy dispersive spectroscopy (EDS) on the SEM had been employed to ensure exclusion of Cu as micropillar sector (FIG. 10). For each sample, at least 5 micropillars were compressed for repeatability check.

Figure 9:
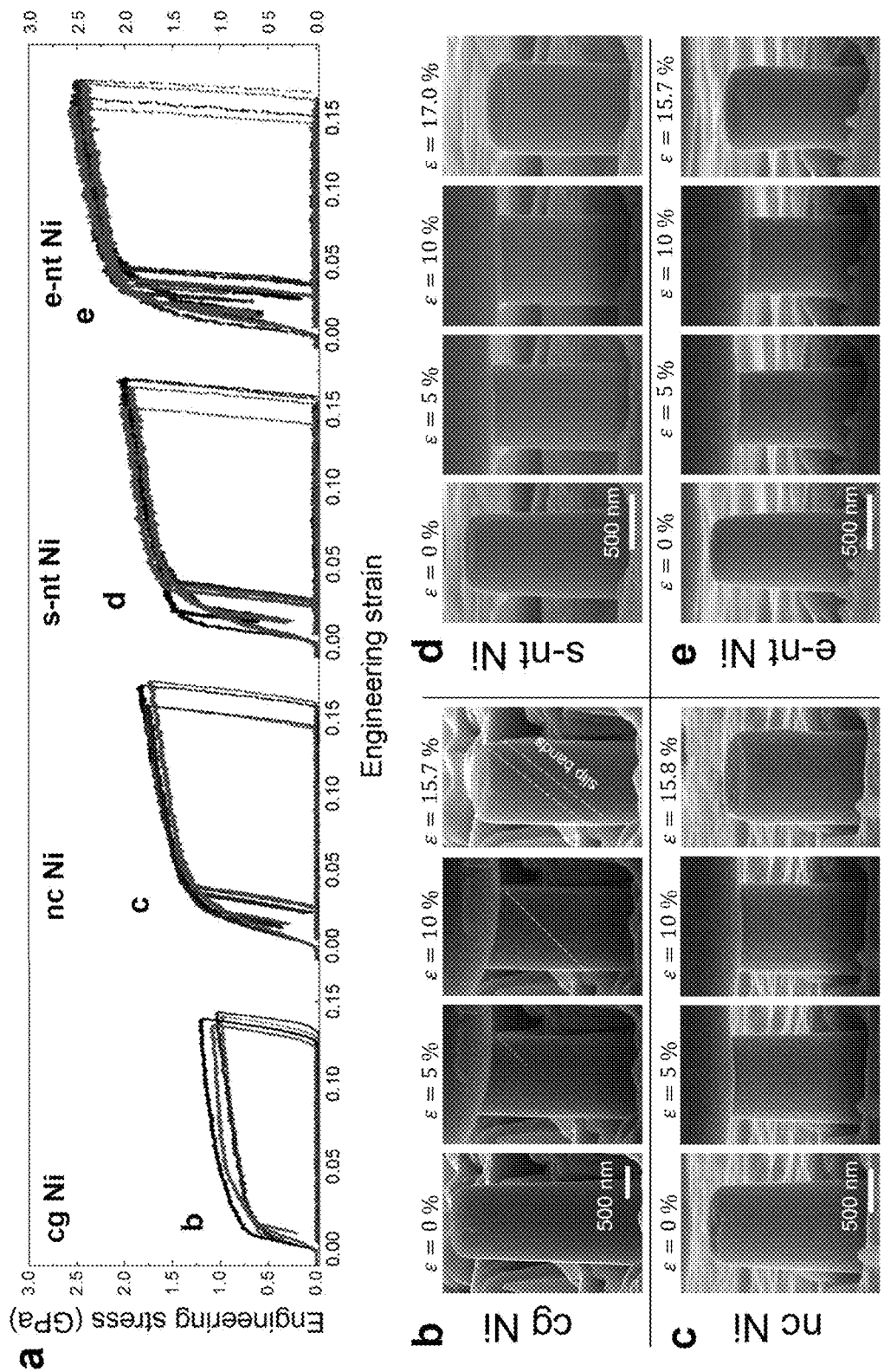
FIG. 9 contains a plot (a) and images (b)-(e) showing in situ compression experiments (inside a scanning electron microscope) on Ni samples prepared by monolithic UHV and hybrid techniques. Plot (a): True stress vs. strain curves of cg-nt Ni, nc Ni, s-nt Ni and nt Ni, showing the mechanical merits for each sample and nt Ni outperforms its counterparts. Images (b-e): Snapshots of deformed micropillars at different strain levels exhibit the geometrical evolution upon deformation.

FIG. 9 shows results of in situ compression experiments. Image (a) of FIG. 9 shows the true stress-strain curves for the nt Ni, s-nt Ni, cg-nt Ni and nc Ni, and their corresponding SEM snapshots taken during deformation up to different strains are shown in images (b), (c), (d), and (e) of FIG. 9 respectively. Referring to FIG. 9, at 5% strain, the flow stress of the nt Ni micropillars is about 2.1 GPa (lower bound of stress is presented), followed by about 1.64 GPa of s-nt Ni, about 1.41 GPa of nc Ni and about 0.88 GPa of cg-nt Ni. The AAEP-induced fine twins enable an increment of the flow stress at 8% strain by a factor of about 2.4 with reference to cg-nt Ni prepared at similar conditions except absence of additive. It is worth noting that the real-time monitoring ability allows us to develop an "impact crater" method (expressed in experimental session) in order to align micropillar axial direction to that of the indenter. It is generally known that ex-situ compressions gave ambiguous determination in yield strength, sY, and hardening regime coming after sY because of the misalignment between indenter and micropillars. Two partial unloading curves were deliberately added at strains less than 3% to inspect the alignment reliability. The slopes of loading and partial unloading curves virtually agree with each other. The yield strength for each material is given in Table 2 below:

TABLE 2

Structural information and mechanical responses of the as-fabricated Ni specimens.

| Specimen name | Grain size, d (nm) | Twin spacing, t (nm) | Twin plane orientation | Yield strength, $\sigma_Y$ (GPa) | Flow stress (strain = 10%), σ (GPa) |
|---|---|---|---|---|---|
| s-nt Ni | 30 ± 15 | 182 ± 118 | Horizontal | 1.39 ± 0.08 | 1.64 ± 0.07 |
| nc Ni | 34 ± 16 | — | Random | 1.22 ± 0.07 | 1.41 ± 0.04 |
| cg Ni | 454 ± 348 | 33 ± 26 | Inclined (~70°) | 0.60 ± 0.10 | 0.88 ± 0.10 |
| e-nt Ni | — | 22 ± 14 | Horizontal | 1.91 ± 0.07 | 2.10 ± 0.07 |

Nt Ni, s-nt Ni and cg-nt Ni show apparent calculated moduli of 120-135 GPa, whereas nc Ni shows 95-100 GPa after "Sneddon" correction. The significant underestimation of moduli compared to theoretical values (ENi(111)=about 259 GPa; ENi=about 200 GPa) resulted from the Cu base deformation under compression, supported by prior simulations. Nt Ni, s-nt Ni and nc Ni show no evidence of shear offsets, a sign of premature failure due to plastic localization (images (b)-(e) of FIG. 9). The plastic deformation tends to develop at pillar head and gradually transfer downwards, as evidenced by the lateral dilation, which should be distinguished from the catastrophic failure arising from localized softening in some multi-layer structures. Under compressive stress, the crack initiation is suppressed; therefore, the nt Ni shows extensive plasticity under compression, which does not ensure a tensile ductile behaviors. Shear bandings were observed in deformed cg-nt Ni micropillars (image (d) of FIG. 9). No dislocation burst phenomenon was seen in the samples. The strain hardening exponent in nt Ni, s-nt Ni, cg-nt Ni and nc Ni is about 0.6, 0.52, 0.23 and 0.5, respectively.

Given that the uniaxial stress is applied at 90° with respect to the CTBs in the (111)-textured nt Ni, The horizontal TBs, albeit with complex blends of CTBs and ITBs, ought to effectively obstruct dislocation glide as a result of, in <110>{111} systems, both slip planes and slip direction being inclined to CTBs. It should be pointed out that the existing nt materials are mostly equiaxed- or columnar-grained nt materials. To some extent, the GBs greatly influenced the hardening and plasticity of available nt materials. Partitioned mechanical response of TBs is still unclear due to the unavailable GB-free nt materials. The 160- and 100-nm-diameter Cu nanopillars with orthogonal twins were only produced in porous sacrificial templates. While the grain size of nc metals falls below a critical value, about 50 nm based on an analytical predictions, softening would occur due to the GB-mediated activities, such as GB sliding and GB rotation. The nt Ni has not yet experienced the softening as twin spacing is 22±14 nm.

Figure 11:
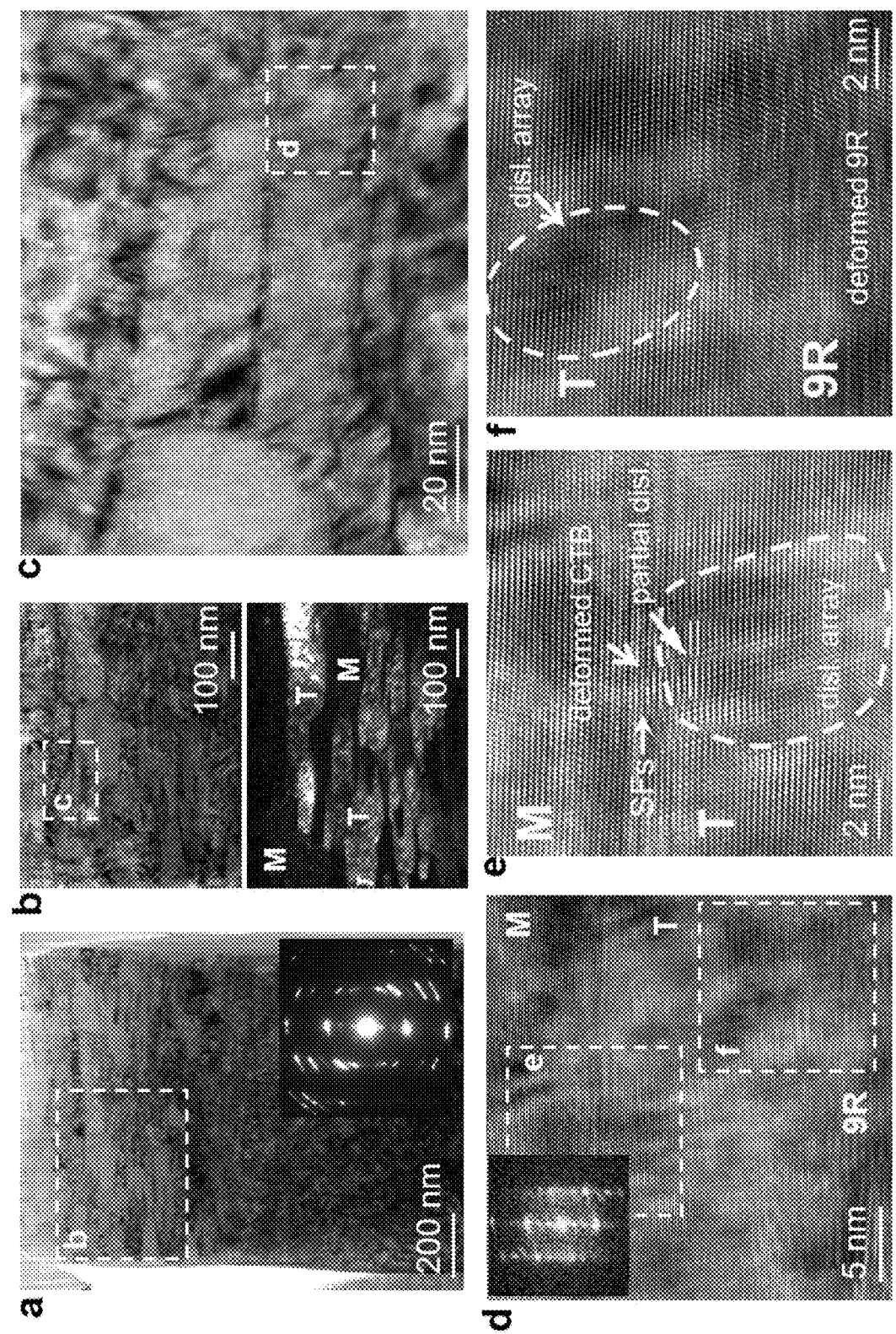
FIG. 11 contains images (a)-(f) showing post-mortem XTEM micrographs of the deformed single-crystal-like, GB-free nt Ni micropillar up to about 15% strain. Image (a): Low magnification bright-field TEM micrograph and corresponding SAD of deformed nt Ni shows the crystallographic rotation, indicated by the arc-shaped diffraction spots compared to diffraction pattern of as-fabricated nt Ni. Images (b) and (c): Low-to-medium magnification TEM images show that twin spacing remains unaffected. The contrasted alternating streaks across TBs and in twin interiors suggest the dislocation activities. Images (d), (e), and (f): High-resolution TEM images show the emitted Shockley partials are blocked by the faulted CTBs. The 9R structures are largely disturbed after reacting with partial dislocations.

The post-deformation (or post-mortem) structure of the nt Ni was examined. The post-mortem TEM analyses on deformed nt Ni were performed along <110> direction and image (a) of FIG. 11 shows that the deformation up to about 17% strain was mostly accommodated by the upper portion of the micropillar. The deposition-induced defects were removed at the upper portion, which resembles a mechanical annealing effect. The inset SAD shows stretched diffraction spots originating from both matrix and twin regimes and implies that the lattice was distorted during deformation. Low-to-intermediate magnification TEM and its corresponding dark-field TEM images suggest that the average twin spacing increases, disappearance of fine twins and elongated CTB segments, perhaps owing to the resolved shear stress exerted on the planar defects (TBs and SFs) on (111) glide planes when lattice became bended (image (b) of FIG. 11). The "steps" consist of partial dislocations capable of migrating on (111) planes. Hence, the collective partial migration-induced detwinning could potentially take place. Zoomed-in TEM micrographs in images (b) and (c) of FIG. 11 reveal that a high-density $\frac{1}{6}$<112>{111} Shockley partials dislocations in lien of $\frac{1}{2}$<110>{111} full dislocations had been emitted upon deformation within restricted twin interiors. A closer examination of deformed TBs finds that an array of Shockley partials is emitted from SF-decorated CTBs. Furthermore, the emitted partials are blocked by the disturbed 9R phase (images (e) and (f) of FIG. 11). The 9R typically contains three repeatable partials, one pure edge partial and two mixed partials with opposite-sign screw component. The incident partials towards 9R are expected to sequentially react with partials in 9R phase, causing distortion in 9R structure and SF-decorated TBs. The high strength of the e-ntNi originates primarily from CTB strengthening. Some other factors also contributed: (i) the (111) texture of nt Ni led to a 3.67 Taylor factor, in contrast to 3.06 in a random-oriented polycrystalline counterpart; (ii) in order for partials to transmit and glide on a complementary ($\bar{1}$11) plane, the SF-decorated TBs and 9R phase set as high energy barriers, but on a second thought the preexisting dislocations and kinks on TBs may act as easy dislocation sources; and (iii) the high-flux electrodeposition introduced high-density defects, which potentially affects the mechanical behaviors.

Corrosion measurements: The potentiodynamic polarization measurements were carried out in a three-electrode cell. A saturated calomel electrode (SCE) and a graphite rod were used as reference and counter electrodes, respectively. Nanotwined (nt), coarse grained (cg) and nanocrystalline (nc) nickel films were used as working electrodes to decipher the corrosion behaviors for three samples. Measurements were performed in 3.5 wt. % of NaCl solutions at about 25° C., using a Gamry 1000 potentiostat/galvanostat system. Potentiodynamic polarization curves were acquired at a scan rate of 1.0 mV/s and the corrosion potential ($E_{corr}$), corrosion current density ($i_{corr}$) and anodic/cathodic Tafel slops ($B_a$ and $B_c$) were determined using Tafel extrapolation method. The polarization resistance ($R_p$) were determined from Stern-Geary equation:

$$R_p = B_a B_c / 2.303 i_{e\ rr}(B_a + B_c)$$

Corrosion rates ($V_{corr}$) were derived by polarization curves using GamryEchem Analyst software.

Figure 12:
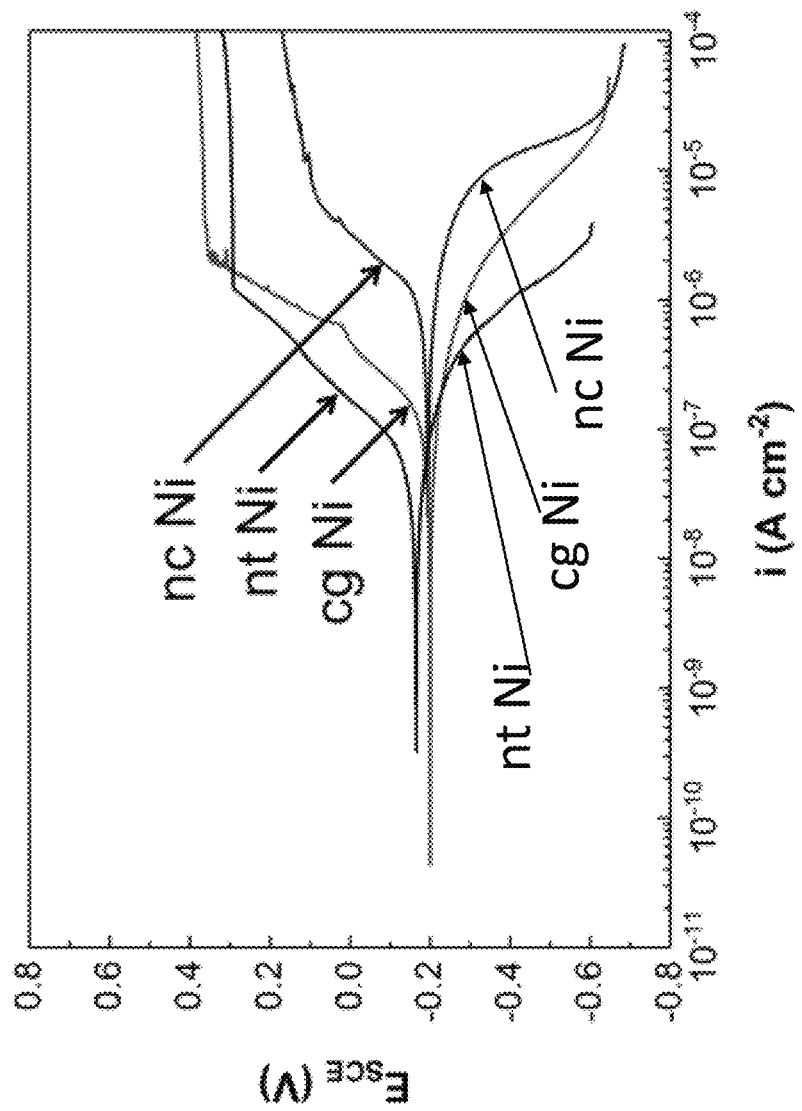
FIG. 12 is a graph showing potentiodynamic polarization curves for different Ni films in 3.5 wt. % of NaCl solution with a constant scan rate of 1.0 mV/s.

FIG. 12 shows the polarization curves for three types of nickel specimens, and the results of potentiodynamic polarization measurements are summarized in Table 3 below.

TABLE 3

Potentiodynamic corrosion results for different Ni films in 3.5 wt. % of NaCl solution.

|  | $E_{corr}$ (mV) | $i_{corr}$ (A/cm$^2$) | $B_a$ (V/dec) | $B_c$ (V/dec) | $R_p$ (kΩ) | $V_{corr}$ (mpy) |
|---|---|---|---|---|---|---|
| nt Ni | −166 | 6.91 × 10$^{-8}$ | 0.413 | 0.103 | 516 | 28 × 10$^{-3}$ |
| cg Ni | −195 | 1.59 × 10$^{-7}$ | 0.494 | 0.087 | 202 | 64 × 10$^{-3}$ |
| nc Ni | −195 | 1.24 × 10$^{-6}$ | 0.512 | 0.081 | 24 | 502 × 10$^{-3}$ |

These results clearly show that the corrosion resistance of nt Ni prepared through a hybrid technique is enhanced dramatically comparing with that of cg and nc counterparts, that is, the nt Ni shows corrosion potential (−166 mV) was much more positive than cg and nc Ni (−195 mV). The nt Ni also showed the lowest corrosion current density in three specimens, which is over one order of magnitude lower than that of nc Ni. To reveal the exact corrosion resistance of those three Ni specimens, both polarization resistance and corrosion rate are presented, where polarization resistance is generally used to determine the resistance of the metal against corrosion, which is inversely related to the corrosion rate. It is clear that the nt Ni has both highest polarization resistance and lowest corrosion rate amongst specimens, indicative of the best corrosion resistance under current corrosion environment.

The improvement of corrosion resistance could be due to the lack of grain boundaries in nt Ni compared with counterparts, as grain boundaries are generally believed more vulnerable to corrosion environments than grain interiors. Meanwhile, the orthogonal twin boundaries in nt Ni, rather than the inclined boundaries, such as the conventional grain boundaries in cg Ni specimens, further minimize the corrosion activation sites under certain corrosion environment, which also contributes to the better corrosion resistance of nt Ni.

High-density growth nanotwins (nt) enable high strength and good ductility but twinning propensity is greatly depressed in metals with high stacking fault energy (SFE), e.g. Ni (120-130 mJ/m$^2$). Moreover, many innate properties and applicative potentials of nt Ni remain unknown due to the lack of growth tactics on nt Ni. In this disclosure is described fabrication of single-crystal-like, grain boundary-free Ni with high-density nanoscale twins through a hybrid technique composed of ultrahigh vacuum technique and additive-assisted electrodeposition. Twinning in single-crystal-like metals with high SFEs is made feasible by synergistic effect of templating and carefully conceived electrochemical recipe. In situ compression studies show the nt Ni achieves a flow strength of about 2.1 GPa and superb strain hardening ability. The corrosion studies show that the nt Ni offers best corrosion resistance capability, in comparison with coarse-grained Ni and nanocrystalline Ni. The hybrid technique opens the door for the fabrication of a wide variety of single-crystal-like nt metals with potentially unique properties.

This disclosure describes a hybrid technique that contains UHV technique and additive-assisted electrodeposition to successfully fabricate a single-crystal-like, grain boundary-free nanotwinned Ni with high stacking fault energy. The intriguing twin boundaries with a twin spacing of 22±14 nm consist of frequent blends of coherent twin boundaries and incoherent twin boundaries. It is shown that the combination of templating and a carefully conceived electrochemical recipe was capable of enhancing twin propensity and twin geometry, and the synergistic effect led to a highly-twinned Ni. The in situ compression studies revealed that the nt Ni delivered a maximum flow stress of about 2.1 GPa and can be strain hardening by blocking high-density partial dislocations. The nt Ni also manifested improved corrosion resistance capability.

Based on the above description, this disclosure describes a high-strength nickel coating on a substrate, the coating comprising single-crystal-like nickel containing nanotwins and stacking faults. In some embodiments of the high-strength nickel coating of this disclosure, the spacing of the nanotwins is in the range of about 2 to about 50 nm. In some embodiments of the coating, the boundaries between the nanotwins are substantially parallel to the substrate-coating interface. In some embodiments of the coating of this disclosure, the boundaries between the nanotwins are at an inclination to the substrate-coating interface. In some embodiments of the coating, the substrate is a metallic material. Non-limiting examples of a metallic material suitable as a substrate for the coating of this disclosure include but are not limited to single-crystal metals, such as copper, copper alloys and stainless steels, and other metallic materials that have crystal structure and lattice parameters similar to Ni. In some embodiments of the coating, single-crystal copper used as a substrate has a (111) orientation. In some embodiments of the coating the yield stress of the coating is in the range of about 1.0 to about 2.0 GPa. In some embodiments of the coating, flow stress of the coating is in the range of about 1.5 to about 3 GPa. In some embodiments of the coating, the thickness of the coating is in the range of about 100 nm to about 50 micrometers.

This disclosure also describes a method of fabricating a high-strength nickel coating on a substrate. The method includes providing a substrate containing a copper coating obtained by sputtering and capable of acting as a cathode, and then electrochemically depositing single crystal-like nickel coating on the copper coating using a nickel anode and an electrolyte. In some embodiments of the method, the substrate is a metallic material. A non-limiting example of a metallic material that can be used as a substrate for the method of this disclosure is single-crystal copper and its alloys. In some embodiments of the method using single-crystal copper as a substrate, the single-crystal copper has a (111) orientation. Single-crystal metal, such as copper, copper alloys and stainless steels, that have similar crystal structure and lattice parameters to Ni, can be possible substrates to electrochemically deposition single-crystal like nt Ni. In some embodiments of the method the electrolyte contains 0.85 M nickel (II) chloride hexahydrate ($NiCl_2.6H_2O$), 0.065 M nickel (II) sulfamate tetrahydrate ($Ni(SO_3NH_2.4H_2O)$) and 0.4 M boric acid ($H_3BO_3$) where M represents the molar concentration (mol/Liter of the electrolyte) of chemicals in the aqueous electrolyte. In some embodiments of the method, the electrolyte further contains an organic additive. A non-limiting example of such an organic additive is sodium saccharin. In some embodiments of the method employing sodium saccharin as an organic additive in the electrolyte, the sodium saccharin is in the range of about 0.003 to about 0.01 M of the electrolyte.

While the invention has been described in terms of particular embodiments and investigations, it should be apparent that alternatives could be adopted by one skilled in the art. For example, process parameters could be modified and appropriate materials could be substituted for those noted. As such, it should be understood that the above detailed description is intended to describe the particular embodiments represented in the drawings and certain but not necessarily all features and aspects thereof, and to identify certain but not necessarily all alternatives to the embodiments and their described features and aspects. Accordingly, it should be understood that the invention is not necessarily limited to any embodiment described herein or illustrated in the drawings, and the phraseology and terminology employed above are for the purpose of describing the disclosed embodiments and investigations and do not necessarily serve as limitations to the scope of the invention. Therefore, the scope of the invention is to be limited only by the following claims.

The invention claimed is:

1. A nickel coating on a substrate, the coating comprising single-crystal nickel containing nanotwins and stacking faults, the single-crystal nickel being grain boundary-free and having stepped twin boundaries.

2. The nickel coating of claim 1, wherein the spacing of the nanotwins is in the range of about 5 to about 40 nm.

3. The nickel coating of claim 1, wherein the boundaries between the nanotwins are substantially parallel to the substrate-coating interface.

4. The nickel coating of claim 1, wherein the boundaries between the nanotwins are at an inclination to the substrate-coating interface.

5. The nickel coating of claim 1, wherein the substrate is a metallic material.

6. The nickel coating of claim 5, wherein the metallic material is single-crystal copper.

7. The nickel coating of claim 6, wherein the single-crystal copper has a (111) orientation.

8. The nickel coating of claim 1, wherein the yield stress of the coating is in the range of about 1.0 to about 2.0 GPa.

9. The nickel coating of claim 1, wherein the flow stress of the coating is in the range of about 1.5 to about 2.5 GPa.

10. The nickel coating of claim 1, wherein the thickness of the coating is in the range of about 100 nm to about 50 micrometers.

11. The nickel coating of claim 1, wherein the coating is a component of an integrated circuit, a semi-conductive integrated circuit, or a micro/nanoelectromechanical system.

* * * * *